United States Patent
Crapisi et al.

(10) Patent No.: US 6,512,676 B1
(45) Date of Patent: Jan. 28, 2003

(54) PRINTED CIRCUIT BOARD STIFFENER

(75) Inventors: Thomas Alex Crapisi, Jim Falls, WI (US); Jeffrey Scott Cogner, Eau Claire, WI (US); Stephen Cermak, III, Elk Mound, WI (US); Stephen A. Bowen, Chippewa Falls, WI (US); Rodney Ruesch, Eau Claire, WI (US); David Paul Gruber, Mondovi, WI (US); Bonnie Kay Dobbs, Bloomer, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/619,725

(22) Filed: Jul. 20, 2000

(51) Int. Cl.⁷ .............................. H05K 5/00; H05K 5/04; H05K 5/06
(52) U.S. Cl. ...................... 361/752; 361/753; 361/825
(58) Field of Search ................................ 361/711, 719, 361/720, 818, 825, 752, 753, 829; 174/252, 250; 211/201, 41.17, 26, 189; 312/223.2, 265.1

(56) References Cited

U.S. PATENT DOCUMENTS

| | | | | |
|---|---|---|---|---|
| 4,807,407 A | * | 2/1989 | Horn | 52/125.2 |
| 4,988,577 A | | 1/1991 | Jamieson | 428/573 |
| 5,186,377 A | * | 2/1993 | Rawson et al. | 228/180.1 |
| 5,198,279 A | | 3/1993 | Beinhaur, et al. | 428/99 |
| 5,378,545 A | | 1/1995 | Akulow | 428/573 |
| 5,453,580 A | * | 9/1995 | Franke et al. | 174/250 |
| 5,557,503 A | | 9/1996 | Isaacs et al. | 361/719 |
| 5,893,466 A | * | 4/1999 | May et al. | 211/41.17 |
| 5,900,850 A | * | 5/1999 | Bailey et al. | 345/55 |
| 5,934,485 A | * | 8/1999 | Harris et al. | 211/26 |
| 6,084,182 A | | 7/2000 | Rehlander | 174/250 |
| 6,260,265 B1 | * | 7/2001 | Kownacki et al. | 174/135 |

* cited by examiner

*Primary Examiner*—Albert W. Paladini
*Assistant Examiner*—Tuan Dinh
(74) *Attorney, Agent, or Firm*—Schwegman, Lundberg, Woessner & Kluth P.A..

(57) ABSTRACT

Apparatus and methods for reducing circuit board flexing is presented. The apparatus is fastened to a printed circuit board to provide rigid support for reducing bending and flexing. In one embodiment, a rigid frame is provided that is adapted to be fastened to one or more components and to be fastened to a printed circuit board. The frame is adapted to elevate the attached component from the PCB surface allowing components to be mounted on the PCB therewith. The frame is adapted to occupy minimal printed circuit board surface area so as not to displace electronic components. In another embodiment, an elongated truss-like stiffener is provided that is adapted to be fastened to one side of the printed circuit board and adapted to span the printed circuit board. The elongated stiffener is adapted to have an open structure to minimize cooling flow disturbance and weight. The elongated stiffener includes a plurality of legs forming a truss-like structure. The stiffener supports the printed circuit board to resist bending and flexing stresses. In yet another embodiment, a combination of one or more stiffeners and one or more frames are provided such that the printed circuit board resists bending and flexing stresses.

10 Claims, 10 Drawing Sheets

PRINTED CIRCUIT BOARD STIFFENER

TECHNICAL FIELD OF THE INVENTION

The present invention relates generally to the field of printed wiring boards and, more particularly, to mechanical stiffener apparatus and methods for rigidifying printed circuit boards.

BACKGROUND

Modern high performance computers contain a number of printed circuit boards (PCB) to carry and interconnect the various integrated circuit chips and other components that make up the computer system. Computers may be configured to have one or more subsystems, each in its own right a computer, that are interconnected into a larger, greater capacity computer. Each subsystem may contain basically the same components assembled in a chassis. Within a given subsystem, there may be, among others, a processor board, a power board, and any number of secondary or daughter boards that are carried upon a support structure within the subsystem chassis. These subsystems of boards are carried in racks in the computer chassis.

Processor boards are so named as they have attached to them one or more processors, or central processing units (CPU). The CPU is an integrated circuit (IC) chip that is considered the "brains" of the computer. The processor board serves as a communication medium for the exchange of electrical signals among the one or more attached processors and other electrical components attached to the processor boards, daughter cards, and other components. The processor board itself is sometimes referred to as a backplane, mother board, system board, or mainboard, depending on its function and configuration.

The processor board is a printed circuit board. A PCB is a relatively thin, flat sheet structure. The PCB may be made of laminations of reinforced fiberglass or plastic and metallic interconnects which electrically link the components attached to the board. As flat sheets, PCBs are subject to bending and flexing stresses depending on the weight of the attached components and the method used to attach the PCB to the chassis.

Some state of the art processors are an assembly consisting of a processor module and a power conditioning module with attached heatsink. These assemblies are relatively large and heavy, wherein the structural integrity of the PCB comes into question. The localized weight of the processor assembly, combined with the combined weight of the other components assembled onto the processor board, requires that the PCB be able to support handling, assembly and other stresses within acceptable limits of flexure without compromising the structural integrity of the PCB. Excessive loading will have a detrimental effect on the integrity of the electrical component interconnects and may result in failure of the electrical system.

To mitigate the effects of deflection, support structures for resisting longitudinal and lateral flexing have been attached to PCBs. A processor board is commonly supported to some degree by the mounting bolts used for mounting the processor board to the chassis. Supplemental support is sometimes provided by rigidity enhancers laterally or longitudinally disposed across the processor board. These rigidity enhancers have taken various forms.

Common disadvantages with lateral and longitudinal rigidity enhancers include electrical component interference, cooling air flow blockage and deflection, and lack of strength to support a PCB with attached processor assemblies. Improved lateral and longitudinal rigidity enhancers are needed that minimize electrical component interference, minimize the blockage of cooling air flow, and have sufficient strength to support a fully loaded PCB.

Additionally, for a given printed circuit board size, the large processor assemblies take up considerable surface area of the board. In some cases, components which are commonly attached to the PCB are moved to other locations on the board or moved entirely off the board onto daughter boards. As a consequence, the distances between electrical components become large which is detrimental to the performance of the system as a whole.

Processor assembly mounting structures have been used in the art to support the processor module and power conditioner module as an assembly. These structures have taken the form of a frame that supports the outside edge of the processor assembly. The processor module and power conditioner module are electrically connected, and the assembly is mounted onto the frame. Fasteners are used between the frame and the PCB to mount the processor assembly to the PCB. The frames elevate the processor assembly from the surface of the PCB allowing the attachment of additional electrical components onto the PCB surface that would have been covered by the processor assembly if directly attached. The state of the art processor assembly mounting frame requires considerable PCB surface area, limiting the number of electrical components capable of being attached to the PCB.

There is a need in the art for PCB stiffeners and processor assembly mounting apparatus and methods to address the disadvantage of large processors crowding out electrical components on the processor board as well as being able to minimize the bending and flexing stresses on the PCB due to the weight of the processor assemblies and other components.

SUMMARY

The above-mentioned disadvantages associated with large and heavy processor assemblies mounted on printed circuit boards, and other disadvantages, are addressed by the present invention and will be understood by reading and studying the following specification.

In particular, the present invention is directed to apparatus and methods for enhancing processor board rigidity by providing processor board stiffeners and processor assembly mounting frames adapted to mount on a processor board surface. The stiffeners and mounting frames resist deflection of the processor board due to the weight of the processor assembly and other components. The mounting frame, additionally, provides accommodation for additional electrical components to be attached to the PCB by elevating the processor assembly off of the PCB, thus providing additional PCB surface area for the attachment of components.

One embodiment in accordance with the present invention includes a mounting frame adapted to attach to the periphery of a component for assembly on to a PCB. The mounting frame is a frame-like structure having external dimensions configured to support an attached electrical component or components. The mounting frame comprises a plurality of legs, a cross leg, a rectangular opening, a partial rectangular opening, a plurality of through-holes, and a plurality of pilot holes. The plurality of legs includes an inwardly extending lip. The inwardly extending lip provides additional support material for supporting the attached components while minimizing the PCB surface area covered by the frame. The mounting frame is relatively thin but rigid. The legs of the mounting frame, in combination with the cross leg, define a rectangular opening and a partial rectangular opening. The partial rectangular opening is adapted to accommodate a component attached to the circuit board. A plurality of pilot holes is provided which are adapted to accommodate mounting means for attachment of the mounting frame to a printed circuit board (PCB). A plurality of through-holes is provided and adapted to accommodate mounting means for attachment of one or more electrical components to the mounting frame.

In an alternative embodiment, the mounting frame is adapted such that the mounting frame peripheral edge substantially conforms to the outer dimensions of the electrical component. The mounting frame peripheral edge overlaps the electrical component bottom surface, such that when the mounting frame is placed against the electrical component bottom surface, the mounting frame rests upon the outer portion of the bottom surface. The fastening means is adapted to make use of the through-holes to fasten the mounting frame to the electrical component.

In one embodiment, the peripheral edge of the electrical component overlaps the perimeter of the mounting frame. In an alternative embodiment, the peripheral edge of the mounting frame overlaps the perimeter of electrical component.

One embodiment in accordance with the present invention includes a truss-like stiffener having external dimensions adapted to support an attached printed circuit board having attached components. The stiffener is relatively thin but rigid. The stiffener comprises a plurality of legs which define a plurality of openings. The stiffener has a fastening surface which is adapted to accommodate a fastening means for fastening to a PCB. The openings are provided such as to not significantly impede the flow of cooling fluid.

In one embodiment in accordance with the present invention, the legs may be formed as an integral unit from a solid sheet of flat stock material. The legs may be formed by, among other methods, machining, cutting, and extruding. In another embodiment, the legs are formed as separate units of stock material and subsequently fastened into the truss-like configuration. The legs may be fastened together by, among other methods, welding, brazing, gluing, and screwing.

In another embodiment in accordance with the present invention, the stiffener is made from a material that is thermally conductive. In this embodiment, the stiffener may be used as part of a heat dissipation system. In another embodiment, the stiffener is made from a material that is electrically conductive. In this embodiment, the stiffener may be used as part of a power or grounding system. In another embodiment, the stiffener is made from an electrically insulative material to minimize electrical shorting.

In one embodiment in accordance with the present invention, stiffeners and mounting frames are used in combination to rigidify the PCB. Two stiffeners are positioned on one side of the PCB, in this example, while the opposite side of the PCB has attached one or more mounting frames. The two stiffeners are positioned perpendicular to the long dimension of the mounting frames. The stiffeners span substantially the width of the PCB.

The present invention reduces the deflection to an acceptable amount in an efficient and economic manner which does not interfere with other electrical components or cooling flow requirements.

DETAILED DESCRIPTION

The following detailed description refers to the accompanying drawings which form a part of the specification. The drawings show, and the detailed description describes, by way of illustration specific illustrative embodiments in which the invention may be practiced. These embodiments are described in sufficient detail to enable those skilled in the art to practice the invention. Other embodiments may be used and mechanical changes may be made without departing from the scope of the present invention. The following detailed description is, therefore, not to be taken in a limiting sense. Like reference numbers refer to similar items in all the figures.

Figure 1:
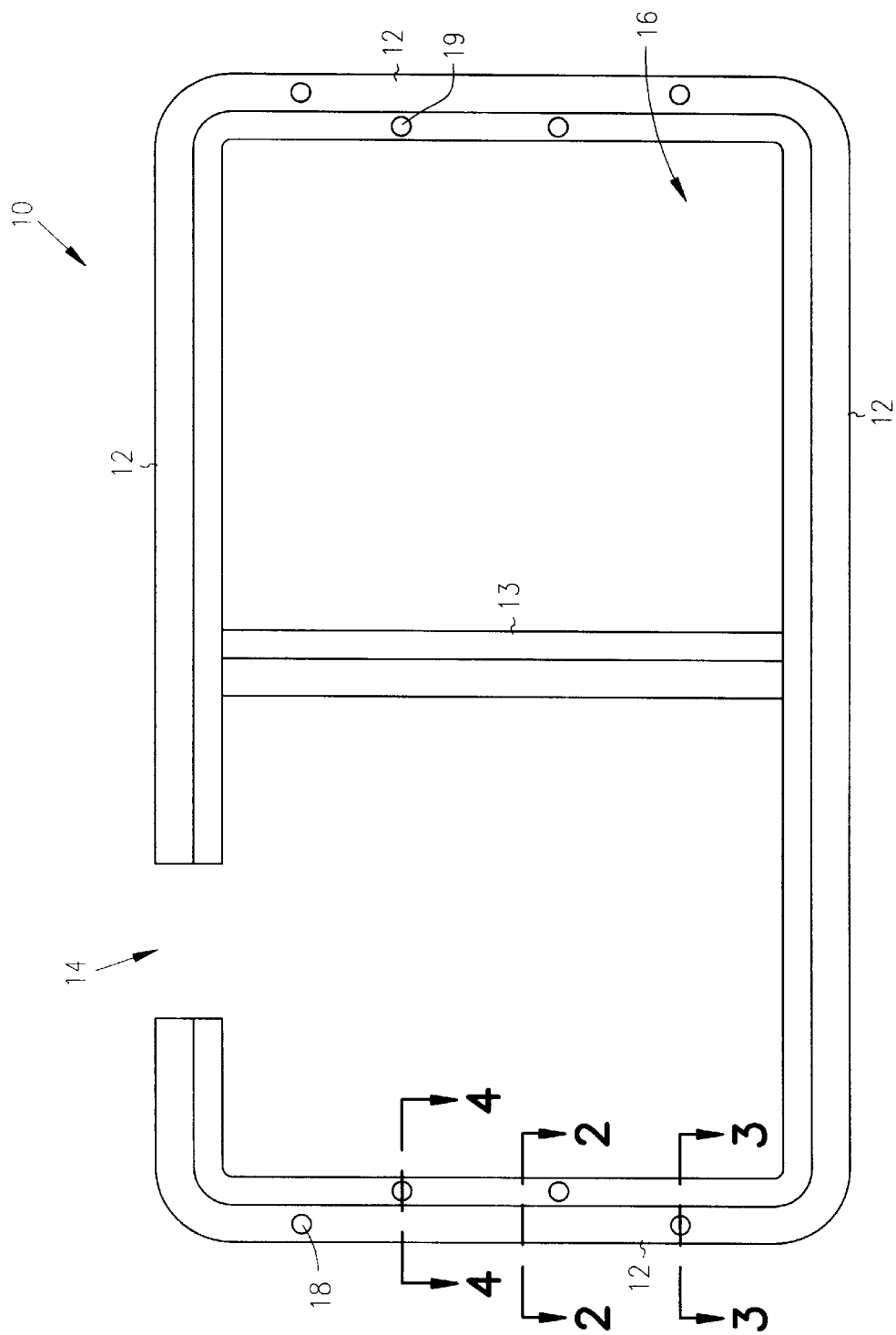
FIG. 1 illustrates a mounting frame, in accordance with one embodiment of the present invention.

FIG. 1 depicts mounting frame 10, in accordance with an embodiment of the present invention. Mounting frame 10 is a frame-like structure having external dimensions adapted to support an attached electrical component or components, which will be described subsequently. Mounting frame 10 comprises a plurality of legs 12, cross leg 13 rectangular opening 16, partial rectangular opening 14, a plurality of through-holes 19, and a plurality of pilot holes 18. Mounting frame 10 is relatively thin but rigid. Legs 12 of mounting frame 10, in combination with cross leg 13, define a rectangular opening 16 and a partial rectangular opening 14. A plurality of pilot holes 18 are provided. Pilot holes 18 are adapted to accommodate mounting means for attachment of mounting frame 10 to a printed circuit board (PCB). A plurality of through-holes 19 are provided and adapted to accommodate a mounting means for attachment of one or more components to mounting frame 10.

In one embodiment, legs 12 and cross leg 13 are formed as an integral unit from a solid sheet of flat stock material. In another embodiment, legs 12 and cross leg 13 are formed by, among other methods, machining, cutting, and extruding. Legs 12 and cross leg 13 also may be formed as separate units of flat stock material and subsequently fastened into the configuration as illustrated in FIG. 1. Legs 12 and cross leg 13 may be fastened together by, among other methods, welding, brazing, gluing, and screwing.

The dimensions and configuration of mounting frame 10 can take many forms depending on the configuration of the one or more attached components. In the embodiment illustrated in FIG. 1, partial rectangular opening 14 is provided to accommodate an electrical component on the PCB. In other embodiments, partial rectangular opening 14 would not be necessary and other configurations may be used, among others, such as two complete rectangles or one rectangle. It is understood that the configuration of legs 12 and cross leg 13 can take many forms without departing from the scope of the invention.

In the embodiment illustrated in FIG. 1, pilot holes 18 and through-holes 19 are provided to aid in fastening the mounting frame to components and to the PCB. Pilot holes 18 and through-holes 19 are provided for the fastening means and maybe not provided or take other forms for different fastening means. An example of fastening means not requiring pilot holes 18 and through-holes 19 include, among others, clips, adhesive, and brazing.

In one embodiment of a method of use, in accordance with the present invention, an electrical component is attached to mounting frame 10 by a fastening means. In one embodiment, the electrical component is a processor assembly consisting of a processor module and a power conditioner. The processor module and power conditioner are assembled and are in electrical communication via a male/female connector. The processor assembly is mounted onto mounting frame 10 by a fastening means. The assembled processor assembly and mounting frame 10 are then mounted to the PCB with a fastening means. An embodiment of the method of use of mounting frame 10 will be presented subsequently.

Mounting frame 10 may be fabricated from any material, such as rigid plastic or metal. In some embodiments, it may be desirable to make mounting frame 10 electrically conductive. In other embodiments, it may be desirable to make mounting frame 10 electrically insulative. The choice of material for mounting frame 10 will be determined by the application of the invention.

Figure 2:
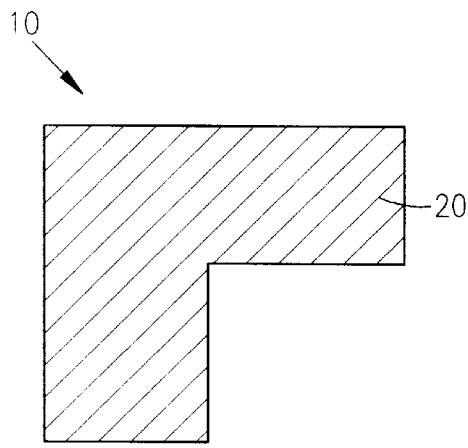
FIG. 2 illustrates a cross sectional view of the mounting frame of FIG. 1, in accordance with one embodiment of the present invention.

FIG. 2 presents a cross-sectional view of mounting frame 10 on section line 2—2 shown in FIG. 1, in accordance with one embodiment of the present invention. Mounting frame 10 includes an inwardly extending lip 20. Inwardly extending lip 20 provides additional support material for supporting the attached electrical components while minimizing the surface contact area between mounting frame 10 and the PCB, as will be discussed subsequently. Leg 10 includes top surface 12, intermediate surface 21 and bottom surface 11. The distance between intermediate surface 21 and bottom surface 11 is adapted to provide clearance for attached components under inwardly extending lip 20 and an attached component.

The manufacture of mounting frame 10 to include inwardly extending lip 20 will be determined by the material from which mounting frame 10 is fabricated. For some materials, such as, among others, metal and plastic, the inwardly extending lip 20 may be machined from a blank of material. In other materials, such as, among others, plastic and fiberglass, it can be produced as part of a molding or lay-up process. Inwardly extending lip 20 may also be a component which must be assembled to resemble the illustration of FIG. 2, without departing from the scope of the invention.

Figure 3:
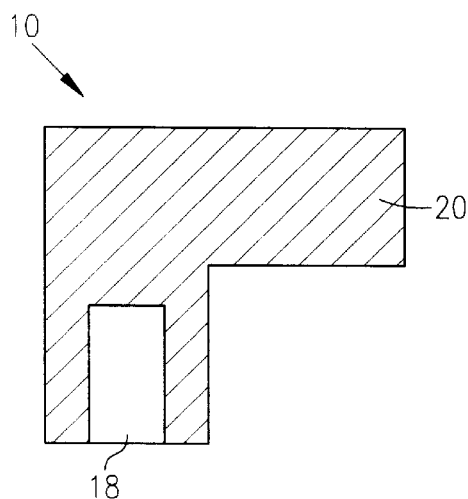
FIG. 3 illustrates a cross sectional view of the mounting frame of FIG. 1, in accordance with one embodiment of the present invention.

FIG. 3 presents a view of mounting frame 10 on section line 3—3 shown in FIG. 1, in accordance with one embodiment of the present invention. Visible in the illustration is a cross section of mounting frame 10, including inwardly extending lip 20, further including pilot hole 18. Pilot hole 18 is provided to accommodate a fastening means for fastening mounting frame 10 to a printed circuit board. Such fastening means may include, among others, fasteners such as screws and bolts. Pilot hole 18 may be threaded to accommodate threaded fasteners.

Figure 4:
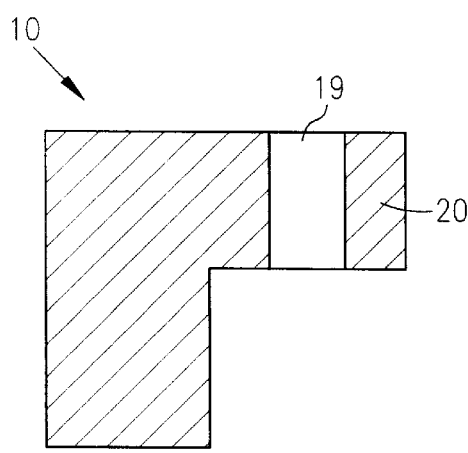
FIG. 4 illustrates a cross sectional view of the mounting frame of FIG. 1, in accordance with one embodiment of the present invention.

FIG. 4 presents a view of mounting frame 10 on section line 4—4 shown in FIG. 1, in accordance with one embodiment of the present invention. Visible in the illustration is a cross section of mounting frame 10, including inwardly extending lip 20, further including through-hole 19. Through-hole 19 is provided in inwardly extending lip 20 to accommodate an attachment means for attaching mounting frame 10 to a component. Such attachment means may include, among others, fasteners such as screws and bolts.

The fastening means applied to fasten mounting frame 10 to components or PCBs, will determine how mounting frame 10 will be adapted to accommodate such fastening means. In some embodiments, the fastening means may not require that mounting frame 10 have pilot holes 18 as shown in FIG. 2, and similarly, through-holes 19 as shown in FIG. 4. The fastening means may consist of, among others, bonding, brazing, and clipping.

Figure 5:
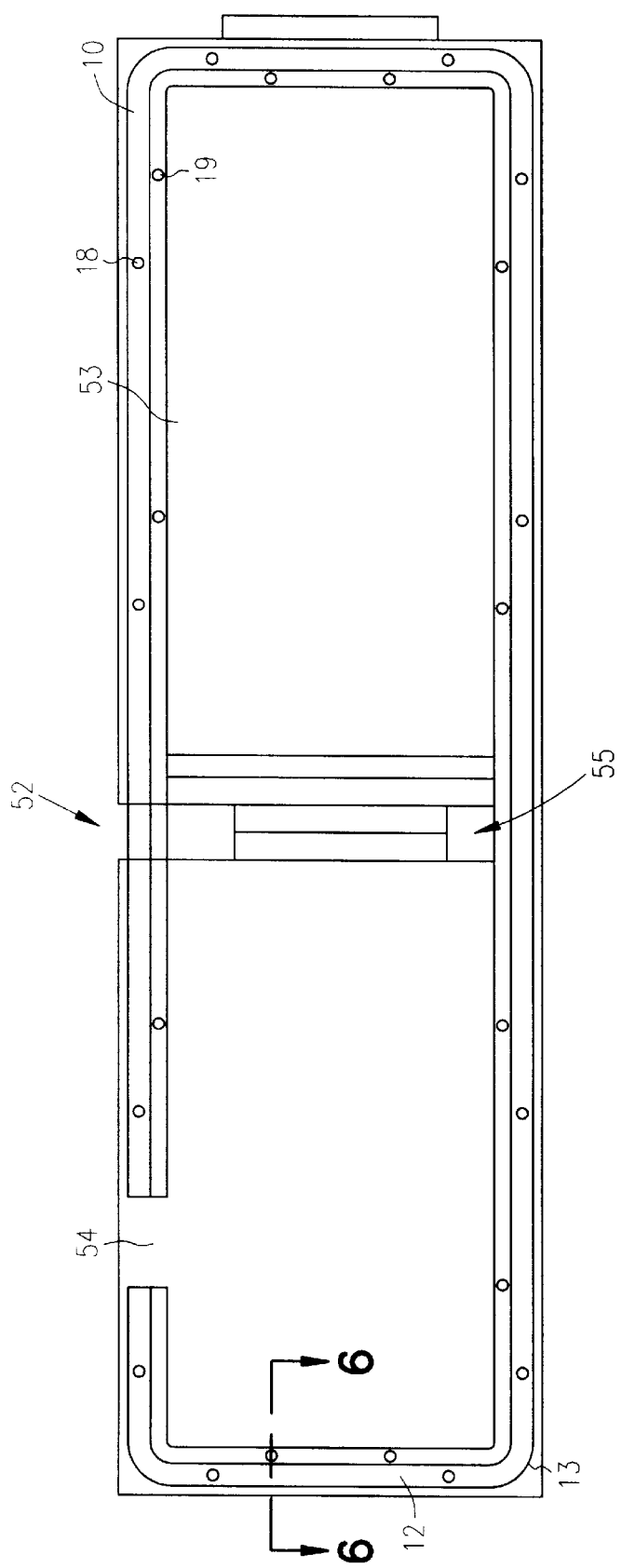
FIG. 5 illustrates the mounting frame of FIG. 1 as assembled to a processor assembly, in accordance with one embodiment of the present invention.

FIG. 5 depicts a bottom view of mounting frame 10 of the embodiment of FIG. 1 as coupled to electrical component assembly 52, in accordance with one embodiment of the present invention. Mounting frame 10 is removably coupled component assembly 52. In this illustration, component assembly 52 consists of a first component 53 and a second component 54. In one embodiment, first component 53 is a processor module and second component 54 is a power conditioner for the processor module. The first component 53 and the second component 54 are in electrical communication through a male/female close-fit coupling 55. In one embodiment, mounting frame 10 is adapted such that the amounting frame peripheral edge substantially conforms to the outer dimensions of the electrical component assembly 52, such that leg top surface 12 abuts the bottom surface of electrical component assembly 52. In such a configuration, when mounting frame 10 is placed against the bottom surface of electrical component assembly 52, leg top surface 12 rests upon the outer portion of the bottom surface of electrical component assembly 52. The fastening means is adapted to make use of through-holes 19 to fasten mounting frame 10 to electrical component assembly 52.

In one embodiment, in accordance with the present invention, the peripheral edge of electrical component assembly 52 overlaps the perimeter of mounting frame 10. In another embodiment, the peripheral edge of mounting frame 10 overlaps the perimeter of electrical component assembly 52. The exact orientation of the electrical component assembly 52 in relationship to mounting frame 10 will depend on the size and weight of electrical component assembly 52. Similarly, the dimensions of legs 12 will depend on the size and weight of the attached electrical components.

Figure 6:
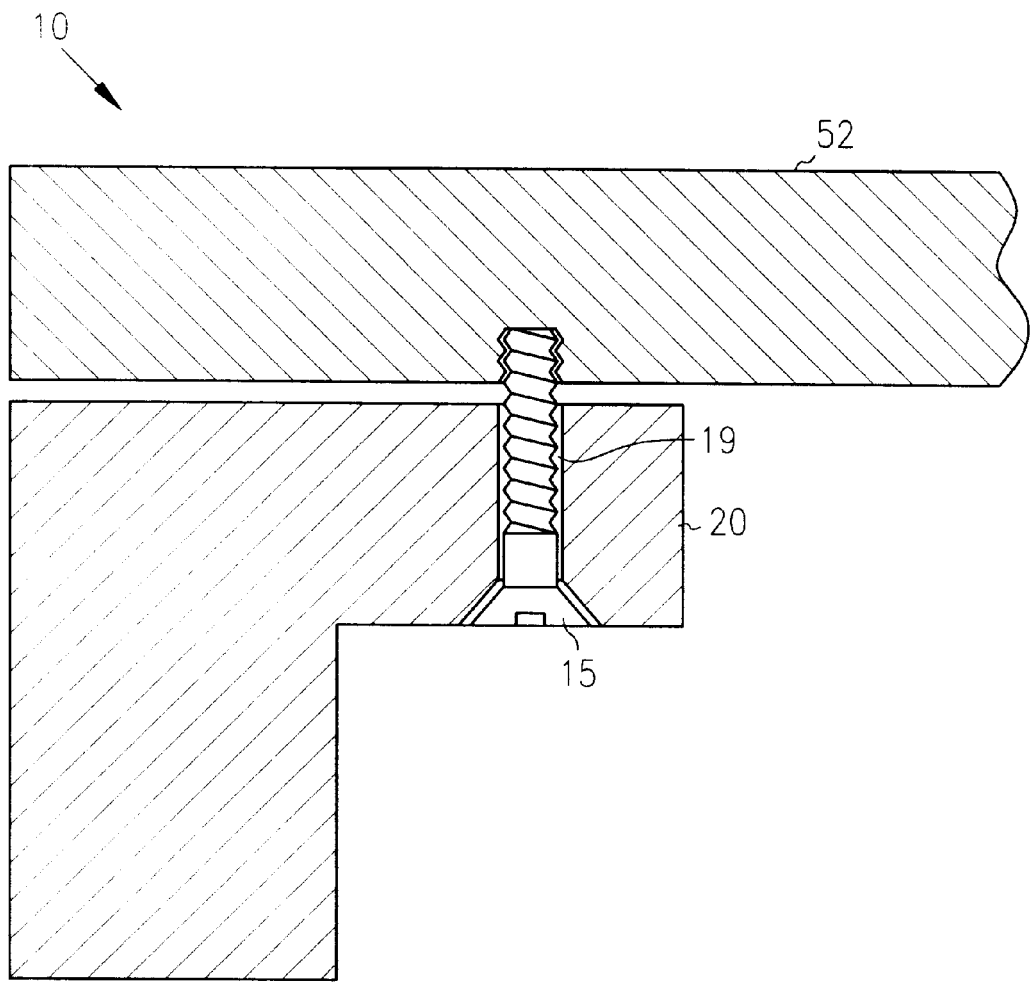
FIG. 6 illustrates a cross sectional view of the mounting frame of FIG. 1 as assembled to a processor assembly, in accordance with one embodiment of the present invention.

FIG. 6 depicts a view of mounting frame 10 and electrical component assembly 52 on section line 6—6 shown in FIG. 5, in accordance with an embodiment of the present invention. A cross section of mounting frame 10, including inwardly extending lip 20 and through-hole 19, and a cross-section of electrical component assembly 52 is shown. Through-hole 19 is provided in inwardly extending lip 20 to accommodate an attachment means 15 for fastening mounting frame 10 to electrical component assembly 52. Such attachment means 15 may include, among others, fasteners such as screws and bolts.

Figure 7:
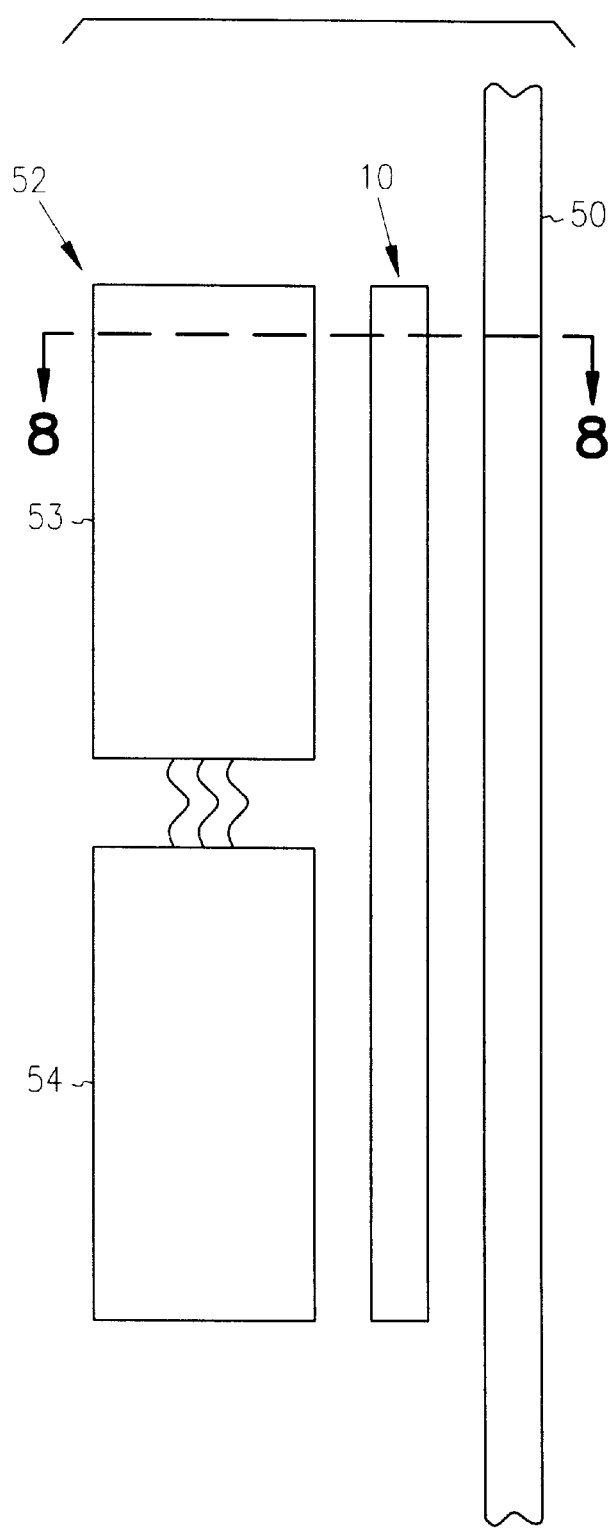
FIG. 7 illustrates a side exploded view of an embodiment of the mounting frame of FIG. 1 with a processor assembly and a printed circuit board, in accordance with one embodiment of the present invention.

FIG. 7 depicts a side elevation exploded view of mounting frame 10 of the embodiment of FIG. 1, electrical component assembly 52, and PCB 50. Mounting frame 10 is disposed between electrical component assembly 52 and PCB 50 as would be configured when assembled. In one embodiment of the method of the present invention, mounting frame 10 is coupled to electrical component assembly 52, and then mounting frame 10 is coupled to PCB 50. Alternatively, mounting frame 10 is coupled to PCB 10 first, and then to electrical component assembly 52.

Figure 8:
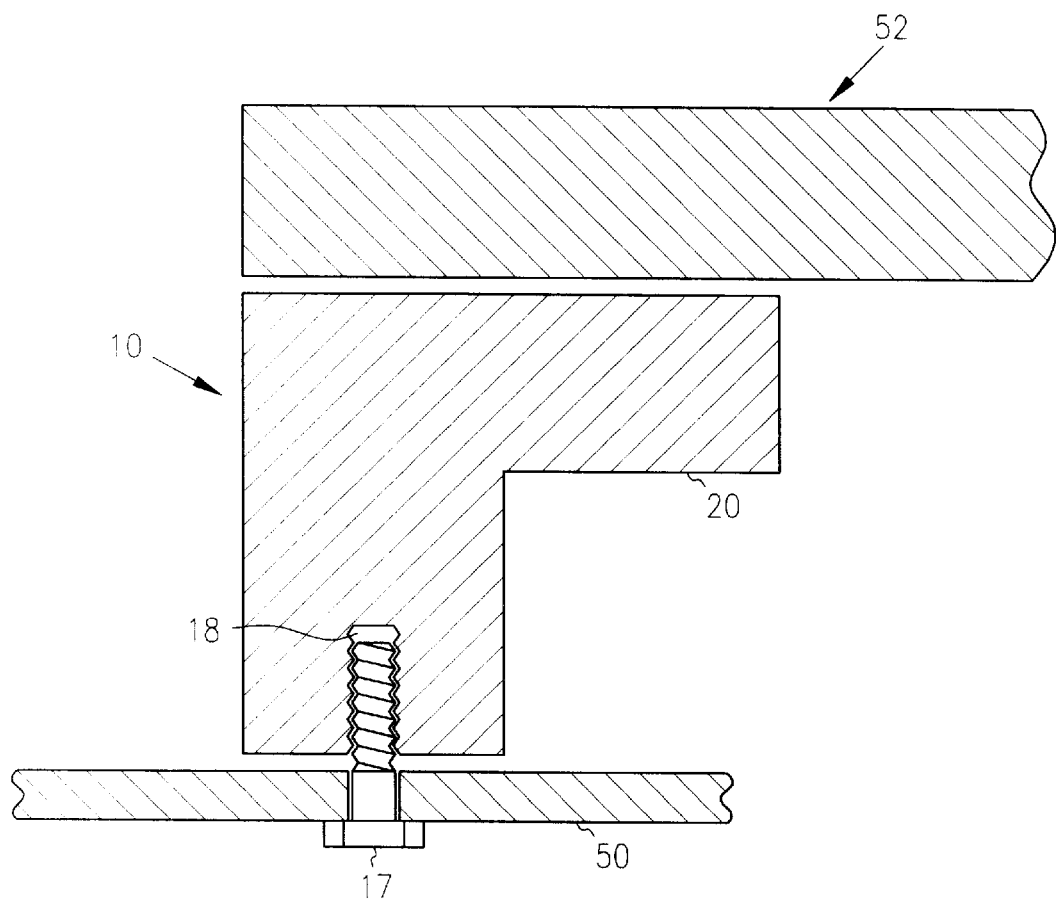
FIG. 8 illustrates a cross sectional view of the mounting frame of FIG. 1 as assembled to a processor assembly and a printed circuit board, in accordance with one embodiment of the present invention.

FIG. 8 depicts a cross sectional view of mounting frame 10, electrical component assembly 52, and PCB 50 on section line 8—8 of the embodiment of FIG. 7. A cross-sectional view of mounting frame 10, including inwardly extending lip 20 and pilot hole 18, a cross-sectional view of electrical component assembly 52, and a cross-sectional view of PCB 50 is shown. Pilot hole 18 is provided in mounting frame 10 to accommodate attachment means 17 for fastening mounting frame 10 to PCB 50. Such attachment means may include, among others, fasteners such as screws and bolts.

In one embodiment, through-holes 19 and pilot holes 18 are not provided in mounting frame 10. Fastening means for this configuration include, among others, bonding, brazing, welding, and gluing.

When mounting frame 10 is fastened to PCB 50, the portion of PCB 50 under inwardly facing lip 20 may be populated with electrical components.

Figure 9:
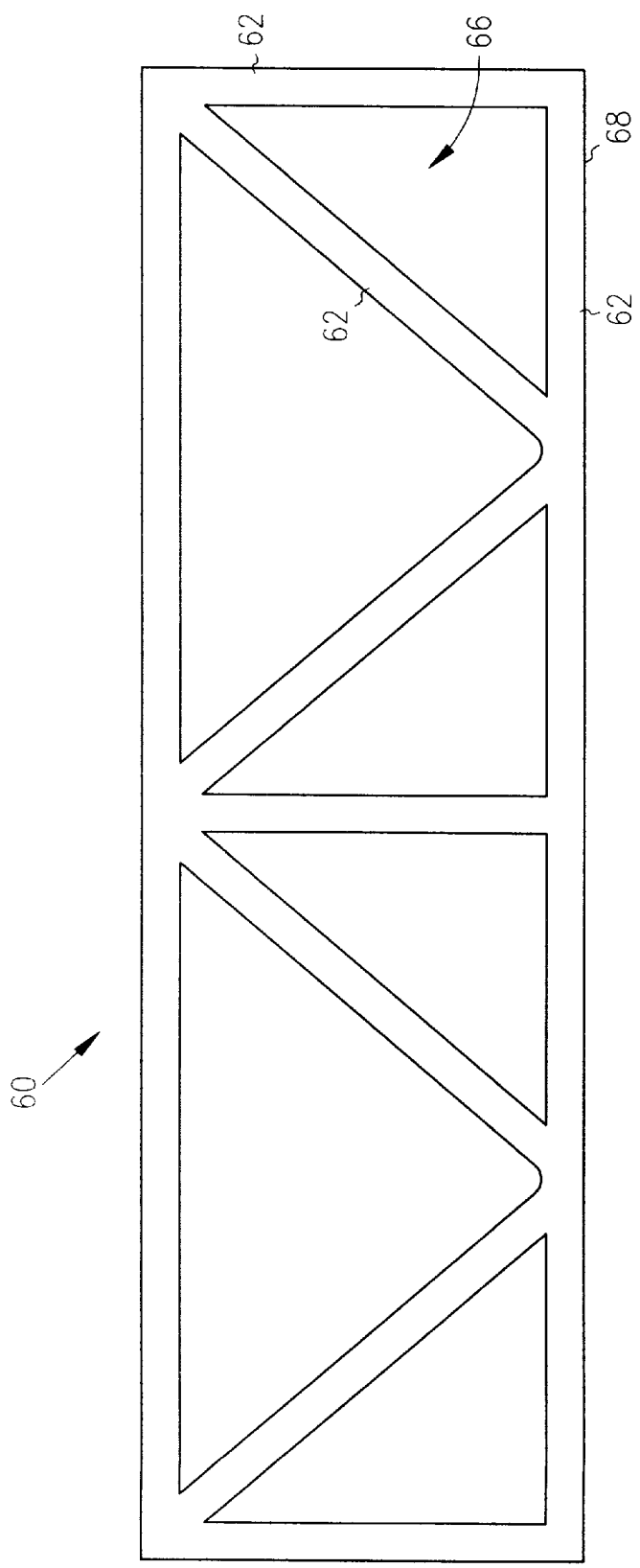
FIG. 9 illustrates a printed circuit board stiffener, in accordance with one embodiment of the present invention.

FIG. 9 depicts stiffener 60 in accordance with one embodiment of the present invention. Stiffener 60 is a truss-like structure having dimensions adapted to support an attached printed circuit board. Stiffener 60 is relatively thin but rigid. Legs 62 define a plurality of triangular openings 66. Stiffener 60 has a fastening surface 68 which is adapted to accommodate a fastening means for fastening to a PCB. Triangular openings 66 are adapted such as to not significantly impede the flow of cooling fluid, as will be subsequently discussed.

Stiffener 60 may be formed as an integral unit from a solid sheet of flat stock material with cut-outs defining legs 62. Legs 62 may be formed by, among other methods, machining, cutting, and extruding. Legs 62 also may be formed as separate units of stock material and subsequently fastened into the configuration as illustrated in FIG. 9. Legs 62 may be fastened together by, among other methods, welding, brazing, gluing, and screwing. Stiffener 60 may be die-cast, routed or otherwise manufactured. Stiffener 60 may be formed of sheet metal, cast metal, plastic, graphite, fiberglass, or any material well suited for stiffening the processor board.

The dimensions and configuration of stiffener 60, as well as the configuration of legs 62 with respect to one another, is dependent on the distribution and weight of the components contained on the PCB. In one embodiment, a partial triangular opening is provided to accommodate and span over an electrical component on the PCB. In other embodiment, legs 62 are arranged to form diamond-shaped openings. These are just examples and other arrangements of legs 62 are possible without deviating from the scope of the invention.

Stiffener 60 may be fabricated from any material, such as, among others, rigid plastic or metal. In some embodiments, it may be desirable to make the stiffener thermally or electrically conductive. In other embodiments, it may be desirable to make stiffener 60 electrically insulative. The choice of material for stiffener 60 will be determined by the application if the invention.

It can be understood that the actual shape of stiffener 60 could be altered to accommodate differing requirements. For example, the height and length of stiffener 60 is adapted to accommodate the size of the board and the space of the chassis. Further, the configuration of legs 62 may define rectangular or trapezoid apertures, among others, to accommodate differing strength requirements. It is also to be understood that the thickness of stiffener 60 could vary as well.

Stiffener 60 is mounted firmly to the processor board in such a way that stiffener 60 supports the PCB against deflection and warping. In one embodiment, stiffener 60 is mounted perpendicular to the surface of the PCB. In one embodiment, stiffener 60 is mounted perpendicular to and substantially parallel to one of the edges of the PCB. In another embodiment, a plurality of stiffeners 60 are used in parallel relationship to each other spanning the PCB.

It is to be understood that stiffeners 60 may be used on any type of PCB that requires board stiffeners to support attached components.

Figure 10:
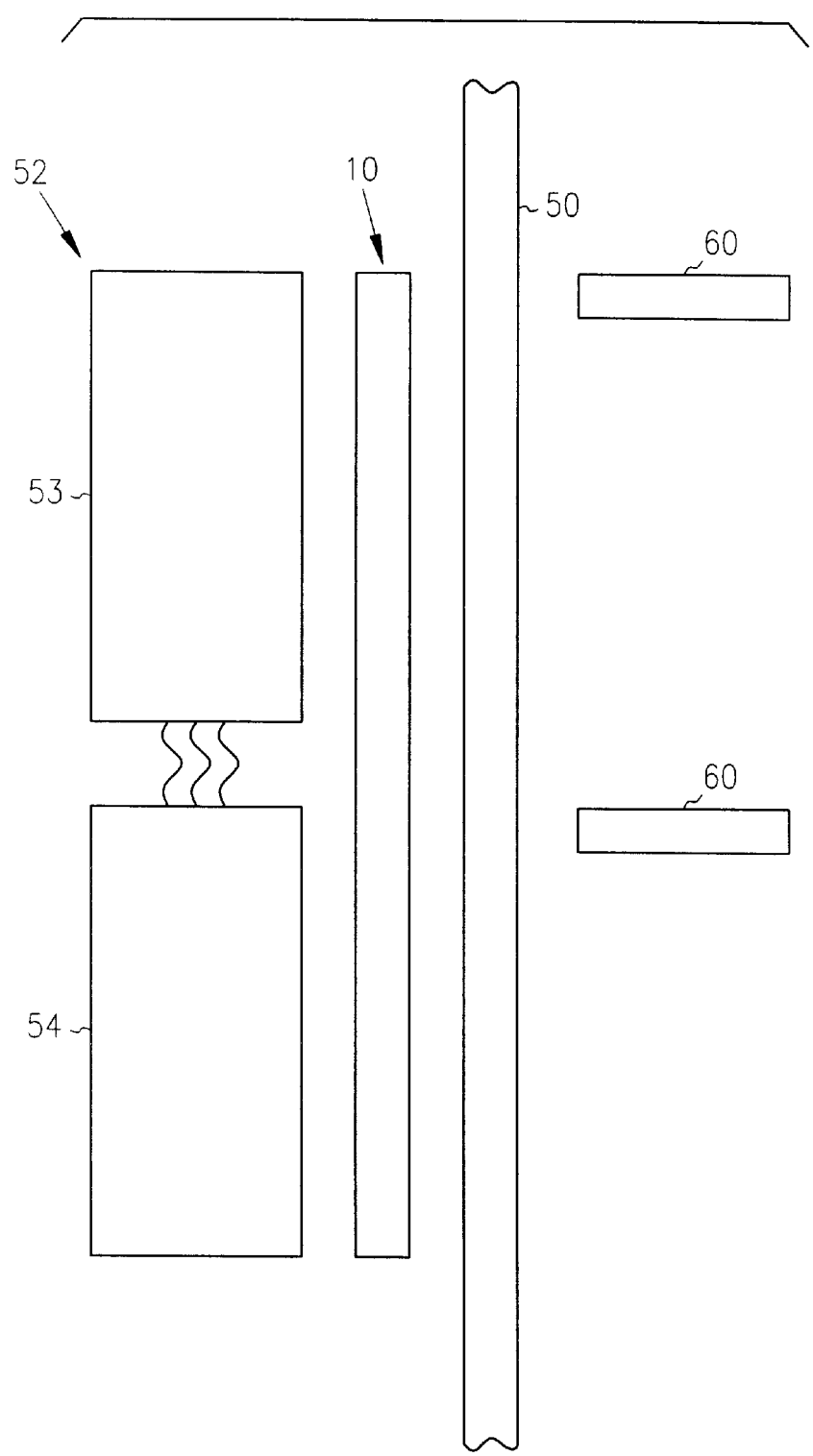
FIG. 10 illustrates a side exploded view of the mounting frame of FIG. 1, a plurality of board stiffeners, a processor assembly and a printed circuit board, in accordance with one embodiment of the present invention.

FIG. 10 depicts a side elevation exploded view of mounting frame 10 and stiffeners 60, electrical component assembly 52, and PCB 50, in accordance with an embodiment of the present invention. Two stiffeners 60 are positioned on PCB 50 on the opposite side of PCB 50 from mounting frame 10, and perpendicular to the long dimension of mounting frame 10. Stiffeners 60 are positioned perpendicular to the width of mounting frame 10 adding additional support under electrical component assembly 52. Stiffeners 60 span substantially the width of PCB 50.

Stiffener 60 may be mounted on the bottom side or the top side of the PCB according to the requirements of the configuration. Stiffeners 60 may be mounted in any of a variety of methods including bolts, epoxy, and cement.

In one embodiment, in accordance with the present invention, one or more stiffeners 60 are adapted to be mounted on the component side of a PCB 50. In an alternative embodiment, one or more stiffeners 60 are mounted to the back side of PCB 50. Stiffener 60 is adapted for avoiding interference with metal runs, solder joints, as well as components.

In some applications it will be difficult to relocate all of the electrical components attached to the PCB to allow room for stiffener 60 to span the entire length of PCB 50 continuously. Therefore it is understood that stiffener 60 can have missing legs 62 or gaps, allowing stiffener 60 to span above the subject components.

The mounted stiffeners 60 are adapted to a height such that they do not interfere with chassis assembly, generally no higher than the height of the tallest component attached to PCB 50 but are of sufficient height to provide the required support to PCB 50.

In one embodiment of the combination mounting frame 10 and stiffener 60, stiffener 60 provides lateral rigidity while the mounting frame provides longitudinal rigidity.

Figure 11:
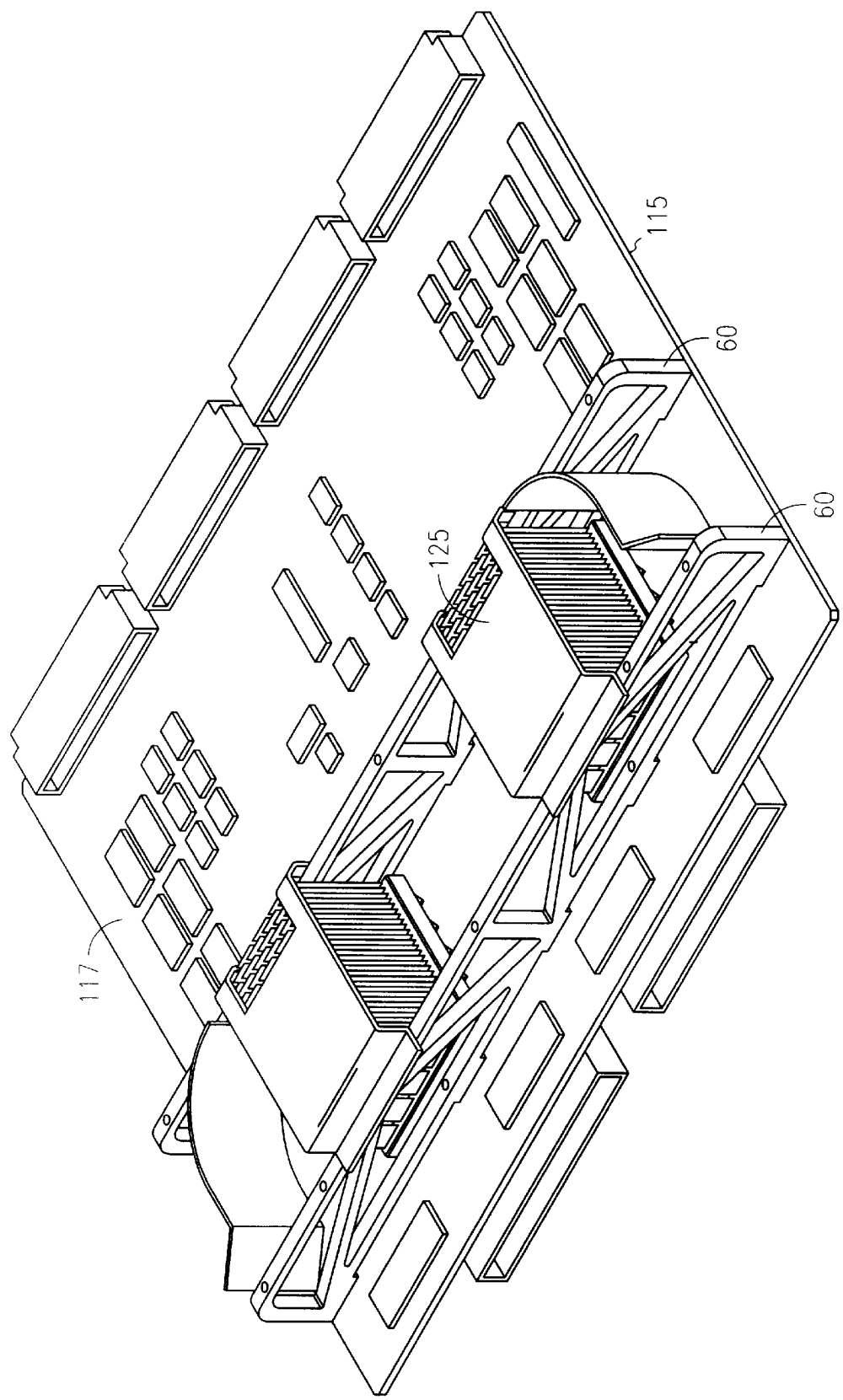
FIG. 11 illustrates a top view of a printed circuit board with attached stiffeners, in accordance with one embodiment of the present invention.
Figure 12:
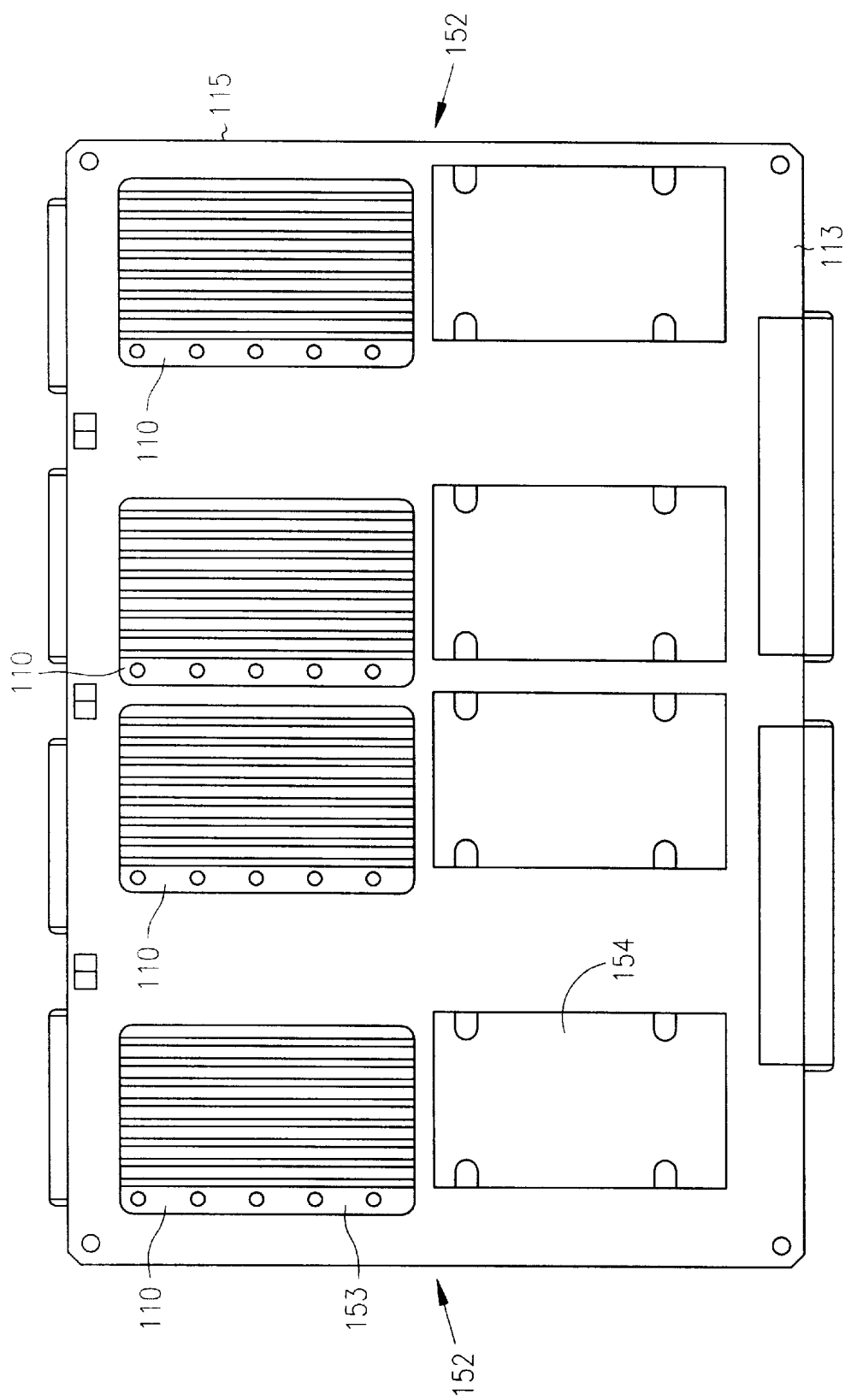
FIG. 12 illustrates a bottom view of a printed circuit board with attached mounting frames, in accordance with one embodiment of the present invention.

FIGS. 11 and 12 are provided to illustrate the method of use of the present invention as applied to an advanced processor board configuration. In this example, electronic components are attached to both sides of processor board 115. In FIG. 11, processor board 115 is a modified McKinley (Intel Corporation, Santa Clara, Calif.) protocol processor board. Two HUB chip sets 125 and other attached components are on processor board top side 117. Two stiffeners 60 are disposed in the longitudinal direction of board 115, with HUB chip sets 125 disposed between the two stiffeners 60. Stiffeners 60 are positioned perpendicular to processor assembly mounting frame 10, shown in FIG. 10, and are located opposite to processor module 54 of processor assembly 52.

FIG. 12 illustrates four processor assemblies 152 and their corresponding mounting frames 110 coupled to processor board back side 113.

The heavy weight and size of the McKinley processor assembly 153 presents a unique structural challenge for processor board 115. The weight of the McKinley processor assembly 153 can cause deflection in an unsupported processor board 115. The present invention reduces the deflection to an acceptable amount, in an efficient and economic manner which does not interfere with other electrical components or cooling flow requirements.

The above-described embodiments are merely illustrative of those suitable for carrying out the objectives of the present invention, and are not intended to represent a comprehensive and exclusive list of such embodiments.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention.

What is claimed is:

1. A printed circuit board stiffener, comprising:

an elongated truss member dimensioned to be mountable to a printed circuit board, the elongated truss member being rigid, the truss member comprising a plurality of legs, the plurality of legs defining apertures, the elongated truss member having a bottom leg defining a fastening surface which runs completely along a bottom surface of the bottom leg such that when the fastening surface of the elongated truss member is mounted flush against a printed circuit board, the fastening surface supports the printed circuit board along the entire length of the elongated truss member to prevent deflection and warping of the printed circuit board; and fastening means for mounting the truss member in perpendicular relationship to the printed circuit board.

2. The printed circuit board stiffener of claim 1, wherein the plurality of legs define triangular apertures.

3. The printed circuit board stiffener of claim 1, wherein the plurality of legs define rectangular apertures.

4. The printed circuit board stiffener of claim 1, wherein the elongated truss member is electrically insulative.

5. A printed circuit board stiffener, comprising:

a member dimensioned to be mountable to a printed circuit board, the member having a plurality of legs, each leg having a first end and a second end, the plurality of legs rigidly joined end to end in an elongated truss-like configuration having a first side and a second side, the first side and second side being parallel, the first side adapted to be fastened to the printed circuit board, the first side having a fastening surface which runs completely along a bottom surface of the first side such that when the fastening surface of the member is mounted flush against the printed circuit board, the first side supports the printed circuit board along the entire length of the first side to prevent deflection and warping of the printed circuit board; and fastening means for coupling the first side to the printed circuit board in perpendicular relationship.

6. The printed circuit board stiffener of claim 5, wherein the plurality of legs define a plurality of triangular apertures.

7. The printed circuit-board stiffener of claim 5, wherein the plurality of legs define a plurality of rectangular apertures.

8. A method of stiffening a printed circuit board, the method comprising:

mounting an elongated truss member having a plurality of rigid legs defining a plurality of apertures to a surface of the printed circuit board such that the elongated truss member is substantially perpendicular relative to the surface of the printed circuit board, wherein the elongated truss member includes a bottom leg defining a fastening surface which runs completely along a bottom surface of the bottom leg such that when the fastening surface of the elongated truss member is mounted flush against the printed circuit board, the fastening surface supports the printed circuit board along the entire length of the elongated truss member to prevent deflection and warping of the printed circuit board.

9. The method of claim 8, wherein mounting an elongated truss member to the surface of the printed surface board includes mounting the elongated truss such that the elongated truss substantially spans a length of the printed circuit board.

10. The method of claim 8, further comprising mounting a plurality of elongated trusses to the surface of the printed circuit board such that the plurality of elongated trusses are in a parallel relationship with each other.

* * * * *

UNITED STATES PATENT AND TRADEMARK OFFICE
CERTIFICATE OF CORRECTION

PATENT NO. : 6,512,676 B1
DATED : January 28, 2003
INVENTOR(S) : Stephen A. Bowen et al.

It is certified that error appears in the above-identified patent and that said Letters Patent is hereby corrected as shown below:

<u>Title page,</u>
Item [74], *Attorney, Agent, or Firm* insert -- , -- after "Kluth".

<u>Column 10,</u>
Line 30, delete "circuit-board" and insert -- circuit board -- therefor.

Signed and Sealed this

Ninth Day of September, 2003

JAMES E. ROGAN
*Director of the United States Patent and Trademark Office*